United States Patent
Ebner

(10) Patent No.: US 7,489,213 B2
(45) Date of Patent: Feb. 10, 2009

(54) SURFACE ACOUSTIC WAVE TRANSDUCER

(75) Inventor: Thomas Ebner, Munich (DE)

(73) Assignee: Epcos AG, Munich (DE)

( * ) Notice: Subject to any disclaimer, the term of this patent is extended or adjusted under 35 U.S.C. 154(b) by 385 days.

(21) Appl. No.: 10/568,049

(22) PCT Filed: Aug. 20, 2004

(86) PCT No.: PCT/EP2004/009371

§ 371 (c)(1),
(2), (4) Date: Feb. 10, 2006

(87) PCT Pub. No.: WO2005/036742

PCT Pub. Date: Apr. 21, 2005

(65) Prior Publication Data

US 2006/0273868 A1    Dec. 7, 2006

(30) Foreign Application Priority Data

Sep. 29, 2003   (DE) ................. 103 45 239

(51) Int. Cl.
*H03H 9/64*   (2006.01)
*H03H 9/145*   (2006.01)

(52) U.S. Cl. ............... 333/193; 333/196; 310/313 B; 310/313 C

(58) Field of Classification Search ............. 333/193, 333/196; 310/313 B, 313 C
See application file for complete search history.

(56) References Cited

U.S. PATENT DOCUMENTS

| 5,646,584 | A | * | 7/1997 | Kondratyev et al. | ......... 333/193 |
| 5,831,492 | A | | 11/1998 | Solie | |
| 6,777,855 | B2 | * | 8/2004 | Bergmann et al. | ...... 310/313 B |
| 7,071,796 | B2 | * | 7/2006 | Ueda et al. | ................ 333/195 |
| 2002/0158715 | A1 | * | 10/2002 | Nakamura et al. | .......... 333/193 |

FOREIGN PATENT DOCUMENTS

JP        2001-237666        8/2001

OTHER PUBLICATIONS

Translation of Written Opinion for Application No. PCT/EP2004/009371.

* cited by examiner

*Primary Examiner*—Barbara Summons
(74) *Attorney, Agent, or Firm*—Fish & Richardson P.C.

(57) ABSTRACT

A surface acoustic wave (SAW) filter includes a transducer having an acoustic track to pass a SAW. A center frequency of the filter excites the SAW. The acoustic track includes cells along a longitudinal direction of the acoustic track. Each cell has electrode fingers. The cells include different cell types, where a cell type is defined by a connection sequence of electrode fingers of a cell. At least some of the cells are functional cells, each for exciting and/or reflecting the SAW. There are at least two functional cells, each of which includes at least one wide electrode finger and at least one narrow electrode finger. A reflective strength of a target functional cell is configurable by changing a width of an electrode finger in the target functional cell but by maintaining an overall width of the target functional cell substantially constant.

20 Claims, 7 Drawing Sheets

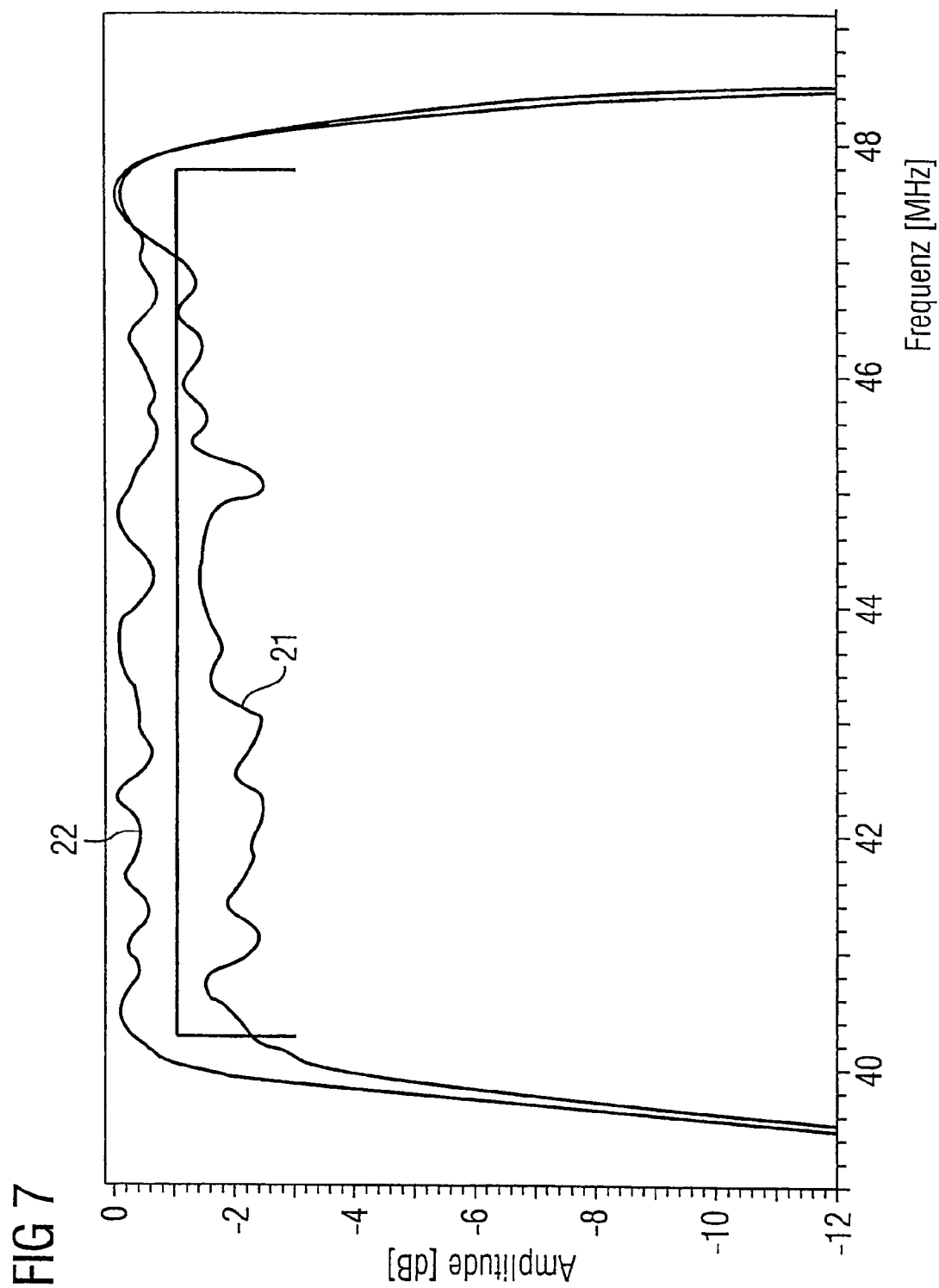

SURFACE ACOUSTIC WAVE TRANSDUCER

TECHNICAL FIELD

The invention relates to a transducer operating with surface waves (SAW-transducer, SAW=Surface Acoustic Wave).

BACKGROUND

A SAW-transducer normally includes two comb like electrodes that have engaging electrode fingers. This structure is arranged on a piezoelectric substrate and is used for electro acoustic transformation of a (high-frequency) electric signal into an acoustic wave and vice versa. SAW-transducers are especially used in band pass filters of data transfer systems.

The electric behavior of a filter is normally defined by a transfer function (frequency response of the amplitude and the phase of the figurative signal). An important description of the transfer function especially is the waviness (ripple) of the group delay in the pass band of the filter.

The acoustic behavior of a transducer can be characterized (locally in the longitudinal direction) by weighting functions (exciting function as well as reflection function). The weighting functions depend on the longitudinal coordinate and describe the distribution of this excitation as well as reflection strength determined in the transducer. The weighting functions of a transducer can be determined on the basis of the preset electric filter qualities. From the calculated weighting function, one can infer the necessary connection sequence and design of the electrode fingers. However, this connection is not clear.

What are familiar are, for example, what is known as SPUDT-filters (SPUDT=single phase unidirectional transducers) that are distinguished by the fact that its cells—SPUDT-cells—serve to direct the irradiation of the acoustic waves in each case. The directional irradiation comes about through the constructive overlay of the excited and reflected waves in one direction and/or destructive overlay of the excited and reflected waves in the opposite direction.

With the filter design, a low insertion loss of the electric signal in the pass band and at the same time a high suppression of the signal in the cutoff sections of the filter are striven for. In order to be able to simultaneously guarantee a low insertion loss of the signal in the pass band and a high suppression of the signal in the filter attenuation bands that are specified near the pass band, a high flank steepness of the transfer function of the filter is striven for. In order to increase the edge steepness of the transfer function, the impulse response of the filter in the time domain must be extended. For this, in SPUDT-filters for example, the cell sequence is selected in such a way that it comes to a multiple reflection of the acoustic waves in the transducer, whereby the circuit of the wave is accordingly extended in the transducer. The excited wave and the (multiply) reflected wave components overlap constructively or destructively according to their relative phases. The increase of reflection strength that is necessary for this has the disadvantage that thereby also the waviness in the frequency characteristic of the group delay also increases.

A low insertion loss in the pass band with a high suppression in the filter attenuation bands can, in principle, be reached in a two track SPUDT-filter. The passage from a constructive overlay to a destructive overlay of wave components in ranges of bandwidth and cutoff regions that densely arranged together by frequency is, however, impeded in both tracks. This passage defines the edge steepness of the transfer function of the filter. What is especially unsuccessful is achieving a low waviness of, for example, below 50 ns in the frequency characteristic of the group delay in the pass band of the filter with a high edge steepness of the transfer function.

The connection between the filter geometry applicable for propagation of the acoustic waves and the electric filter qualities is extremely complex and can only be assessed for the filter geometry in question with help of costly computational models that consider all multiply reflected wave components. Therefore one cannot simply deduce how a filter should be constructed with electric properties in question.

In addition, it is known that the weighting function of a filter can be improved through an appropriate optimization, so that the non-linearity of the phase response is reduced to a limited extent. However, this is interconnected in the transducer with an undesirable diminution of the reflection strength and with respect to the attainable waviness of the group delay in the pass band leads to insufficient results.

The task of the present invention is to indicate a transducer that is employable in a SAW-filter and that thereby serves to reach a low waviness in the frequency description of the group delay in the pass band of this filter with a high suppression in the filter attenuation band without reduction of the reflection strength.

This task is solved in accordance with the invention by an electro acoustic transducer with the characteristics of claim 1 or 2. Advantageous designs of the invention are to be taken from further claims.

The idea that underlies the first implementation form of the invention is that the resulting phase response of the filter can be influenced out of a complicated overlay of multiply reflected wave components by having uniformly formed cells in a longitudinal direction (the direction of wave propagation) scaled to each other, that is, compressed or expanded.

The acoustic length of a wave that crosses a cell in a longitudinal direction is established by the length of the cell. In passing through the cell, the acoustic wave, which is excited by a specific frequency, e.g., the center frequency of the filter, finds a phase shift corresponding to the cell length. By altering the acoustic length, e.g., by compressing or expanding the cell in a longitudinal direction, the phase shift of the wave component in this cell also changes. By a suitable scaling of the cells—or alternatively by extending the displacement of the last electrode finger of a cell and the first electrode finger of the subsequent cell while retaining the scaling of the finger ordering of the corresponding cell—the non-linearity of the phase response, which comes from multiple reflections and which represents an integral characteristic of the filter, can be evened out. It is thereby possible to reach an especially low waviness of the frequency characteristic of the group delay in the pass band of the filter of, for example, less than 50 ns.

In its initial implementation, the invention provides a transducer that operates by surface waves for electro acoustic filters, especially band-pass filters, that shows at least one acoustic track in which an acoustic surface wave can be excited at the center frequency of the transducer.

The acoustic track is apportioned in a longitudinal direction in cells. At least some of the cells are constructed as function cells (SPUDT cells) that serve to excite and/or reflect the acoustic wave, whereby at least two function cells of a certain cell type are provided.

A cell type is defined by: 1) the connection sequence of the fingers, 2) the relative width of the finger with reference to the wavelength and 3) the relative displacement between the fingers with respect to the wavelength.

The absolute cell length of a function cell is, for example, defined by the displacement of the left edge of the first electrode finger of the function cell that is assigned to the corresponding cell type up to the corresponding edge of the first electrode finger of the subsequent cell, whereby the acoustic wave excited at center frequency in passing through the acoustic distance, which is equal to the absolute cell length, essentially learns a phase shift of $2\pi$ or a whole number multiple of $2\pi$.

It thereby holds for at least two, especially exciting cells of the same cell type that the acoustic wave that is excited with the center frequency of the filter in the transducer, suffers phase shifts $\phi$ and $\phi'$ in the respective differing function cells in traversing an acoustic distance from the beginning of the function cell of the corresponding cell type up to the beginning of the subsequent cell.

The absolute cell lengths of all function cells in a known transducer are selected in such a way that the wave with a certain frequency (for example in the center frequency) always suffers a phase shift of exactly $2\pi$ in traversing these cells.

However, the wave corresponding to the center frequency that meets with a function cell with an acoustic distance modified in accordance with the invention, suffers a phase shift deviating by the value of $2\pi$ in traversing this function cell. Therefore, after traversing the modified function cell, this wave does not match any more the following cells exactly in phase. The contributions of individual function cells to the resulting wave are easily phase-postponed vs. each other to a small extent, which allows an adaptation of the phase of the resulting wave.

A transducer according to the invention has the advantage that a phase adaptation of the acoustic wave in the pass band of the corresponding filter without diminution of the reflection strength is achieved and consequently without diminution of the flank steepness of the transfer function. A low waviness of the group delay can thereby be reached in this transducer with a suitable optimization of the cell lengths.

In the preferred variation of the first implementation form of the invention, at least two of the function cells of a specific cell type are provided that show a geometrical similarity in a longitudinal direction up to the scaling, whereby they are scaled differently in this direction vs., each other, so that in each case they represent different circuits vs. each other for the acoustic wave with a certain frequency.

The difference in the scaling of the differently scaled function cells of the same cell type preferably amounts to between 0.1% and 20%.

In another advantageous variation of the invention, it is proposed, in at least two function cells of the same cell type that show identically constructed electrode finger groups the differently select the displacement between the end position electrode finger of the corresponding function cell and the electrode finger dedicated to this electrode finger of the subsequent cell in different function cells of the same cell type. In this text, an electrode finger group is understood as all electrode fingers of the corresponding function cell. The identically constructed electrode finger groups display in particular a same connection sequence of the electrode fingers the same (with respect to wave length) finger width of the corresponding electrode finger and those in both groups are identical to each other (with respect to wave length) in displacements between the electrode fingers.

The width of the electrode finger is preferably selected in such a way that it essentially amounts to $m\lambda/16$ or deviates from this value by a maximum of 20%, in which m is an integer.

In another variation of the invention, at least one further acoustic track is anticipated that shows essentially the same characteristics as the first named acoustic track, whereby the acoustic tracks are arranged parallel to each other and electrically interconnected with each other.

The second implementation form of the invention relates to a transducer with an acoustic track that is apportioned in a longitudinal direction in cells of different cell types, whereby at least two function cells of the same cell type present at least one wide and at least one narrow electrode finger. In the different function cells of the same cell type, as according to the invention, different reflection strengths are attained, in that cells of the same cell type are optimized as follows.

In the function cells that are to be optimized, each according to whether the reflection strength should be reduced or raised, a part of the finger width of the narrow, that is the non-reflective, finger is cut off and this part of the finger width is added to the wide, that is reflecting, fingers, or a part of the finger width of the wide finger is cut off and this part of the finger width is added to the narrow fingers. In the cells that optimized as according to the invention, the sum of the relative changes with respect to the cell length of all electrode fingers is zero.

By a narrow electrode finger in the sense of the discovery is understood an electrode finger whose width in comparison to the width of an electrode finger that is designated as wide electrode finger is, for example, smaller by a factor of at least 2.

The optimized cell differs from the non-optimized by the fact that the sum of the relative widths of all narrow electrode fingers with respect to cell length is variously selected by a difference of $+\alpha(\alpha\neq 0$, preferably $/\alpha/<0.1)$. At the same time, in the optimized cell, the sum of the relative widths with respect to cell length of all wide electrode fingers is variously selected by a difference of $-\alpha$, so that the relative latitudinal alteration of all electrode fingers is zero. The displacements for the fingers in the different cells of the same cell type preferably remain constant.

Several cells of the same cell type differ from each other by the fact that at most 20% of the width of one or more fingers is distributed on another or several other fingers.

The alteration of the relative finger widths according to the invention in the transducer is defined through a weighting function (the reflection), which defined by only a few parameters.

The second implementation form of the invention has the advantage that the reflection strength of individual cells can be continuously varied with justifiable expenditure of the CPU time.

Which fingers are narrowed in the optimization of the reflection strength according to the invention and which are widened depends on the cell class (e.g. EWC-cell class, Hanma-Hunsigner cell class) and the cell type. The size, by which the fingers are widened and/or narrowed can be easily decided from a weighting function defined by a few parameters.

By the optimization of the reflection strength of individual cells as accorded by the invention there was particular success with equalizing the discretization errors in the realization of continuous weighting functions of reflection into a discreet transducer geometry—with a limited number of the cells in the acoustic track. This is important especially in filters with a low center frequency and a large wave length resulting from it, since only a few cells can be accommodated on the length that is available, whereby the scanning of the continuous weighting functions fails very extensively with the same large discretization errors by analogy.

The first and the second implementation form of the invention can be combined together whereby a function cell optimized according to the second implementation form is, for example, additionally compressed vs. the length of a non-optimized cell, or lengthened. Thereby the metallization ratio and consequently also the spread speed of the acoustic wave is the same in an optimized and a non-optimized cell.

Through the additional scaling of the cells changed in accordance with the second implementation form of the invention, there was particular success in compensating for the unintentional offset of the reflection and exciting centers that come into existence from the finger latitudinal alteration.

The invention becomes in the following the invention is explained in more detail in the following on the basis of implementation examples and their related figures. The figures show various implementation examples of the invention by means of schematic presentations that are not to scale. Identical or similarly functioning parts are marked with same reference signs. Show in schematic top views are:

DESCRIPTION OF THE DRAWINGS

FIG. 7: the characteristic curves after FIG. 6 in cross-section in the passageway area.

DETAILED DESCRIPTION

Figure 1:
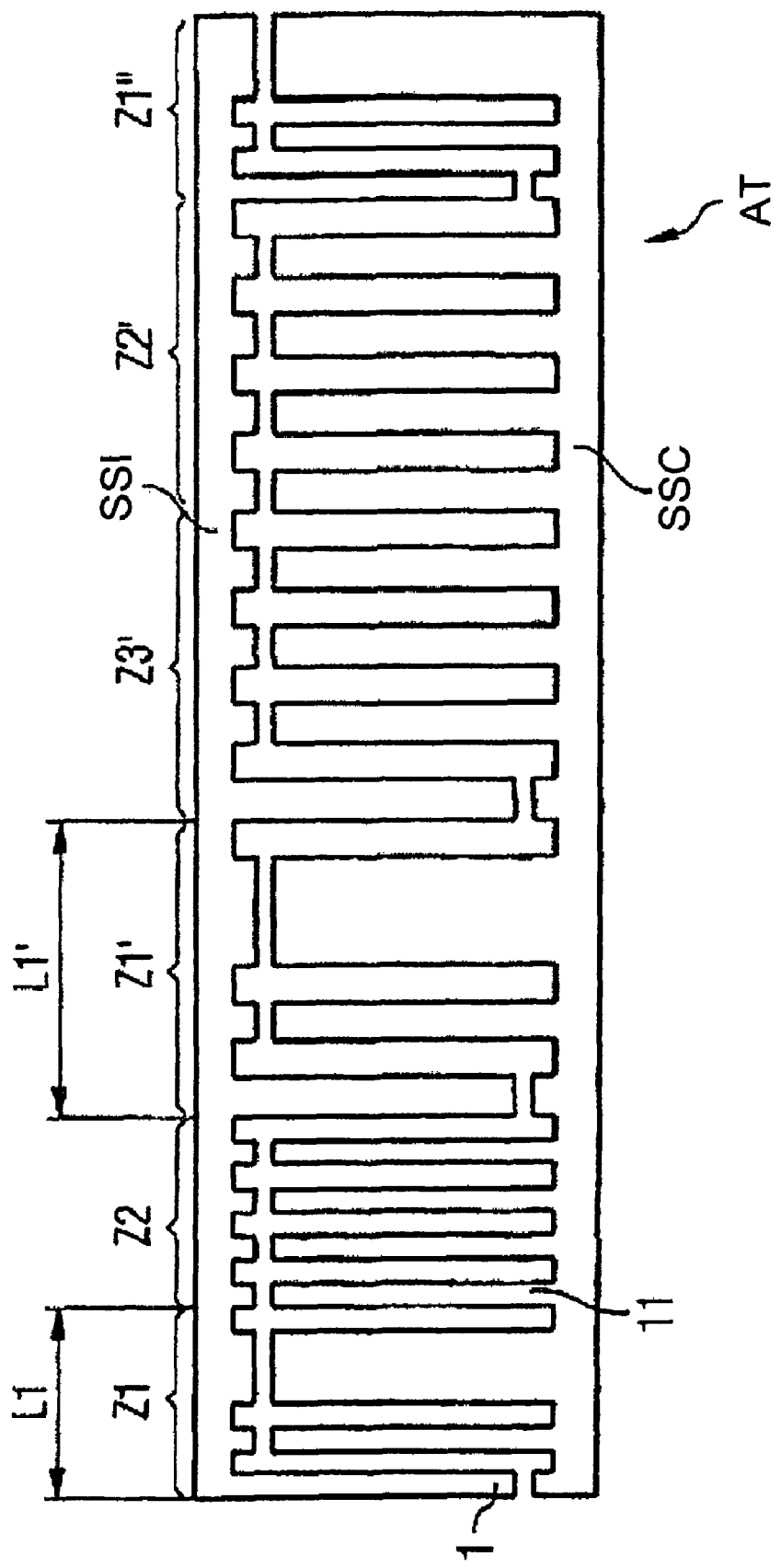
FIG. 1: cross-section of the first implementation form of a transducer according to the invention

FIG. 1 shows in schematic cross-section of an inventive transducer with one acoustic track. This acoustic AT track is arranged on a piezoelectric substrate and shows two bus bars, SSI and SSC of a first and second comb like electrode. At the respective bus bar, electrode fingers are attached, whereby the electrode fingers of the first and the second electrode grasp into one another. Two electrode fingers arranged side by side in a longitudinal direction of different electrodes to excite an acoustic wave. Two neighboring electrode fingers of the same electrode usually seem reflective, unless they are about $\lambda/8$ apart from each other and display a width of $\lambda/8$, that is, if they form a split finger together; see the commentary on the H00 and E00 cells in FIG. 3.

The acoustic AT track is apportioned in a longitudinal direction in cells. Exemplary cell types and classes are described in FIG. 3. Function cells are seen in FIG. 1: Z1, Z2, Z1', Z3', Z2' and Z1'. Cells Z1 and Z2 are differently qualified, but adjusted to the same frequency. Cells Z1', Z2' and Z3' are, in accordance with the invention, modified cells.

Thereby, cells Z1 and Z1" of an initial cell type are similar in the geometrical sense and can be merged by a corresponding scaling in longitudinal direction. The absolute length L1 of cell Z1, measured from the left edge of the first finger 1 of this cell to the left edge of the first finger 11 of the subsequent cell Z2, is thereby distinguished from the length of L1' of the scaled cell Z1', whereby the acoustic wave in passing through both cells travel on different circuits and consequently also experiences different phase shifts. This way, one can expediently modulate the initial phase with which the wave arrives at the nearest cell at the start (Z2 and/or Z3).

Z1" which also belongs to the first cell type is not scaled with respect to cell Z1.

The cells Z2 and Z3 are the cells of a second cell types and are each other scaled like the cells of the first cell types across the way, can immediately or differently be chosen whereby of the scaling degrees for different cell types.

Figure 3:
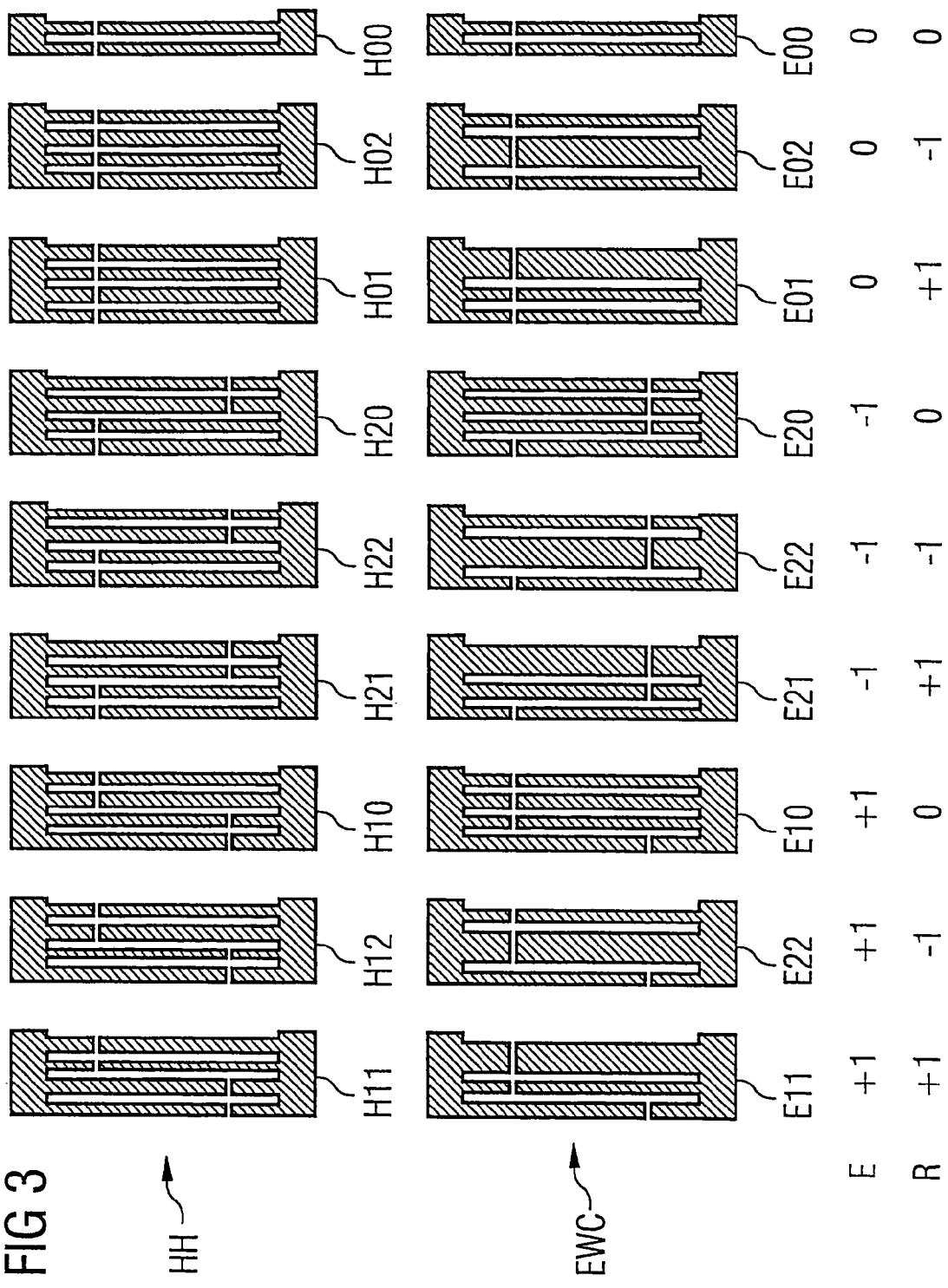
FIG. 3: exemplary cell types that are used in a transducer according to the invention.

Cells Z1 and Z1' correspond to cell type E11 in FIG. 3. They are reflective as well as exciting. Cells Z2 and Z2' correspond to cell type H02 in FIG. 3. They only operate reflectively.

Figure 2:
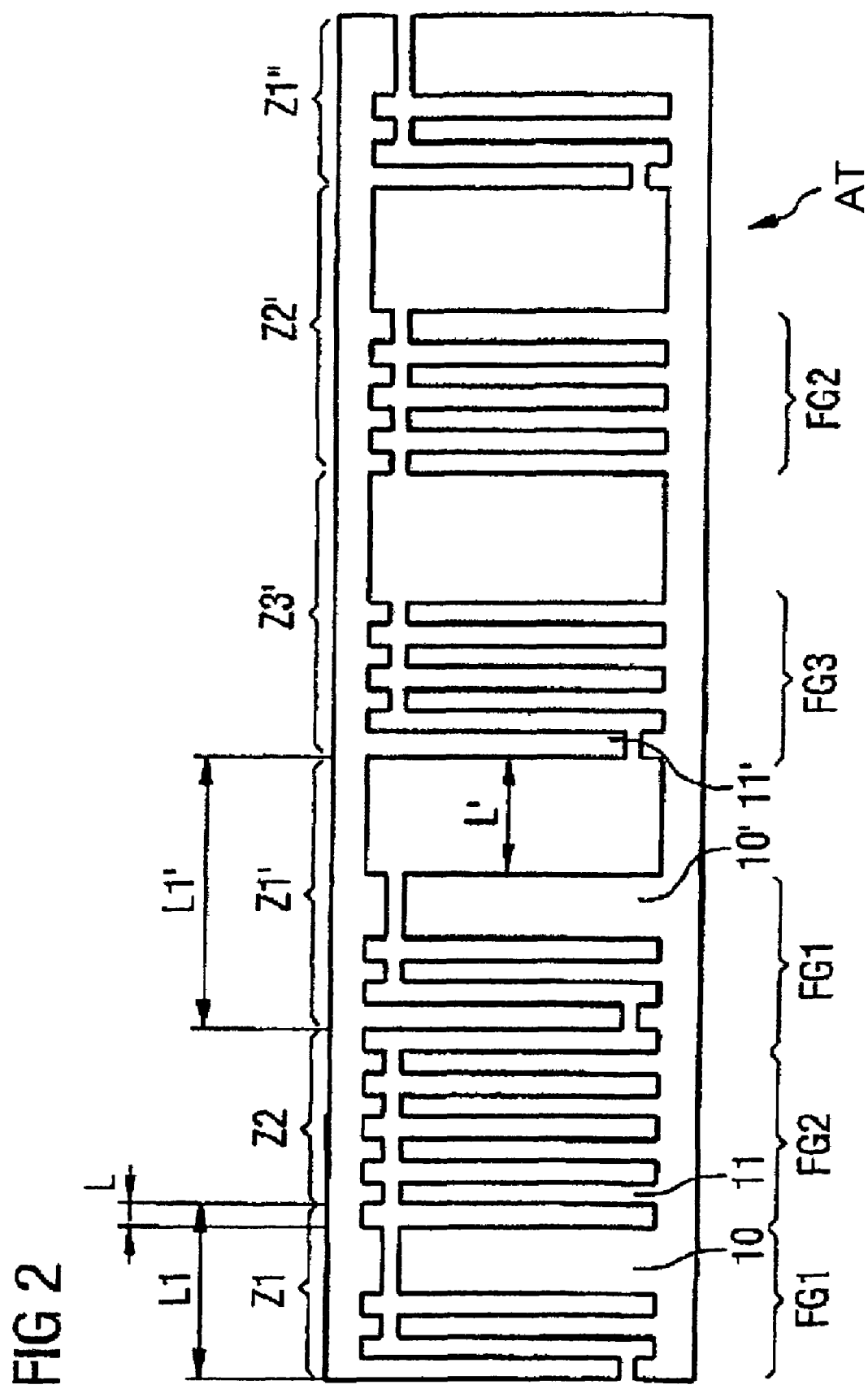
FIG. 2: cross-section of another variation of the first implementation form of a transducer according to the invention.

FIG. 2 shows another variation of the invention. Cells Z1, Z1" and Z2 and the modified cells Z1', Z2' and Z3', which are adjusted to a specific frequency, each display a single electrode finger group FG1, PG2 and/or FG3 (see figure), which includes all electrode fingers of the respective cell.

In this variation of the invention, cells Z1 and Z1' of the first cell type display identically constructed electrode finger groups FG1.

Cells Z1 and Z1' are of various lengths. The different cell lengths in the function cells of the same cell type are thereby attained by virtue of the displacement L between the last finger of the finger group FGI of the corresponding function cell Z1 and the first finger 11 of the nearest cell Z2 of the displacement L' between the last finger 10' of the finger group FGI of the modified function cell Z1' and the first finger 11—the cell Z3 are distinguished.

Analogously, in each case, cells Z2 and Z2' of the second cell type display identically constructed electrode finger groups PG2.

Cell ZC is modified vs. cell Z2 just as has been described.

Alteration of the circuit and/or the absolute cell length in the various cell types can be identically or differently selected.

FIG. 3 shows exemplary cell types of the SPUDT-cells that can be used in a transducer according to the invention. The cell types arranged in the figure above belong to a cell class HH (Hanma-Hunsinger cells). The cell types arranged in the figure above belong to a cell class EWS (EWC cells) of SWC—Electrode Width Controlled.

Each cell is characterized by exciting (call out E in FIG. 3) and reflection (call out E in FIG. 3). The exciting and/or reflection can be positive, negative or equal to zero. The function cells in the sense of the invention are the cells that, with reference to acoustic waves, excite and/or reflect, therefore show $E \neq 0$ and/or $R \neq 0$.

Several cell types, preferably of the same cell class (for example cell types E00-E22 of cell class EWC) can occur mixed in the same acoustic track. The sequence of the cell types in the transducer is determined by the desired transfer function and the thereby specified exciting weighting function and the reflection weighting function of the transducer, whereby the exciting and the reflection of individual cells are adjusted to the corresponding weighting function.

The cell types up to cell types E00 and H00 have a length that corresponds to $n\lambda$. Cell types E00 and H00 with the length $\lambda/2$ display a split finger and have not reflective or exciting function. They are used exclusively for the phase shift of the wave by 180° and are brought into operation in the passing through of a group of function cells with a certain prognostic of the exciting to the other group of function cells (with the reverse prognostic) between the cell groups. If such a cell between two cells with modified cell lengths according to the invention (e.g. Z1' and Z3' in FIGS. 1 and 2, whereby cell Z3' should, however, have its polarity reversed) is anticipated, then it is preferably scaled accordingly and/or stretched. Even if such a cell between one adjusted to the frequency and a modified function cell is anticipated, its dimension can be adjusted such that when passing through this cell the phase shift of the wave of exactly or approximately 180° is achieved.

By the scaling degree of cells E00 and H00 which are selected accordingly, the initial phase of the wave in the next function cell can also be affected.

A reflectively operating EWC-cell (e.g. E01, E02, E11, E12, E21, E22) is a function cell that shows three fingers on the longitudinal scale of a wave length of which one finger is constructed wider than the two others and has a width of $3\lambda/8$. It is anticipated that the width of the wider of the electrode fingers in the transducer according to the invention can deviate by 20% at most from the value $3\lambda/8$.

The EWC-cell (E10, E20), which is used to excite the wave and thus does not contribute to the reflection, is a function cell that displays four fingers on the longitudinal scale of a wave length, whereby the first finger of a first electrode and/or the subsequent three fingers are associated with a second electrode. The width of the electrode finger in such an EWC-cell preferably is obligatorily evenly selected.

The Hanma-Hunsinger cell (H11, H12, H10, H21, H22, H20) that serves to excite the wave is a function cell that shows four fingers on the longitudinal scale of a wave length, whereby the first and the second electrode finger belong to the first electrode and whereby the third and the fourth electrode finger belong to the second electrode.

A Hanma-Hunsinger cell (H10, H20) that is used exclusively for exciting of the wave shows four electrode fingers with the same width. With a Hanma-Hunsinger cell (H11, H12, H21, H22), that is constructed for both exciting and reflection, the electrode fingers are widely differently selected.

The Hanma-Hunsinger cell H01, H02, that is used exclusively for reflection of the acoustic wave, is a function cell that shows four fingers on the longitudinal scale of a wave length that are attached at the same electrode.

Figure 4:
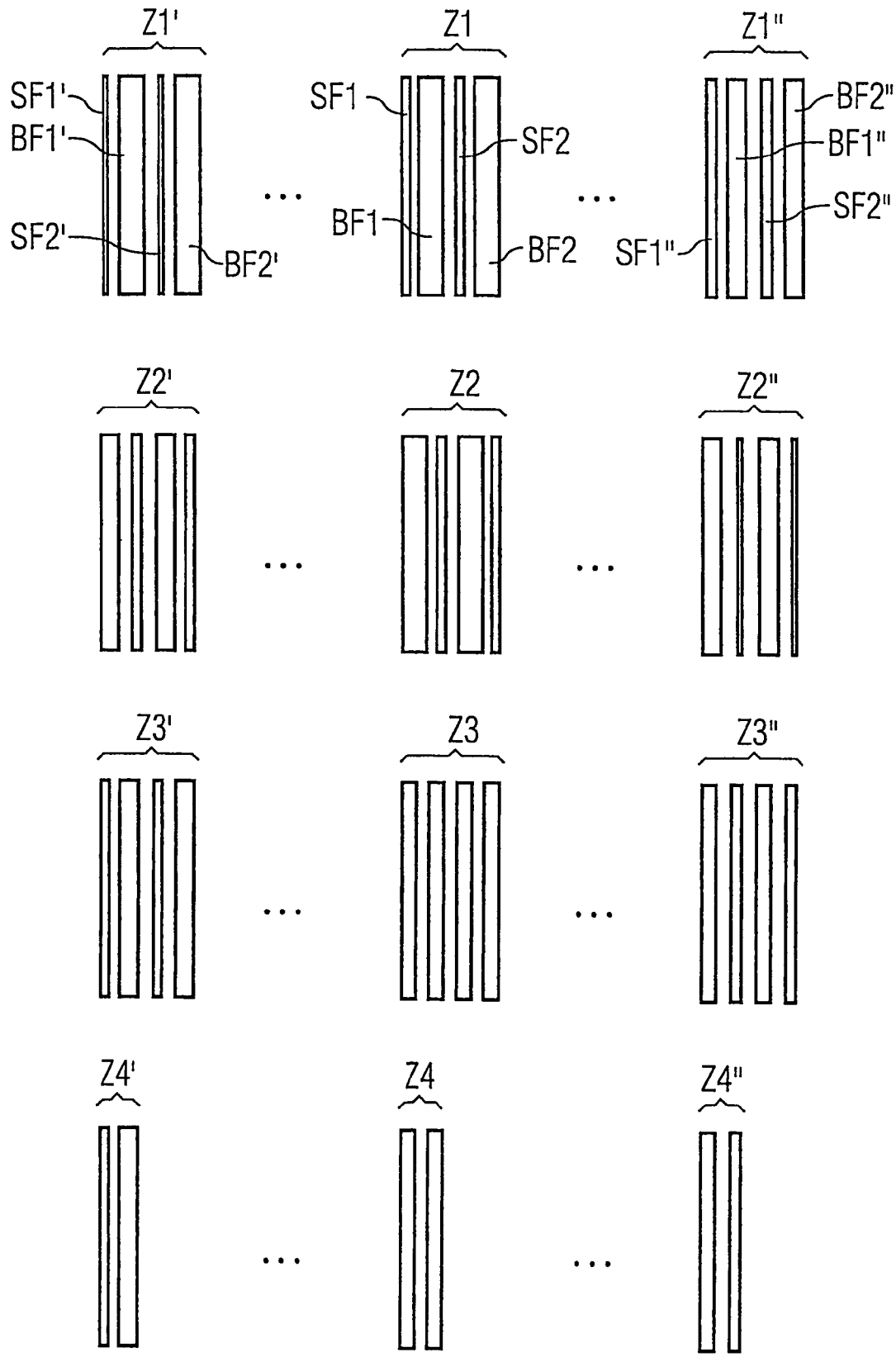
FIG. 4: cross-section of the second implementation form of a transducer according to the invention with cells of the RH-cell classed (Hanma-Hunsinger cells).

FIG. 4 shows a cross-section of a transducer in accordance with the second implementation form of the invention. The transducer does not display optimized function cells Z1-Z4 of the Hanma-Hunsinger cell type as well as corresponding optimized function cells Z1'-Z4' and Z1"-Z4", which are all arranged in one acoustic track.

The Z1 cell and the optimized cells Z1' and Z1" correspond according to the connection sequence of the electrode finger to the cell type H11 or H21. These cells reflect positively (to the right).

The cell Z2 and the optimized cells Z2' and Z2" correspond to the cell type H12 or H22 according to the connection sequence of the electrode finger. These cells reflect negatively to the left.

Cell Z3 and the optimized cells Z3' and Z3" correspond according to the connection sequence of the electrode fingers the cell type H10 or H20. Cell Z4 and the optimized cells Z4' and Z4' correspond to the cell type H00. These cells are non-reflective.

Cell ZI displays two narrow electrode fingers NF1 and NF2 ($1^{st}$ and $3^{rd}$ fingers) and two wide electrode fingers WF1, and WF2 ($2^{nd}$ and $4^{th}$ fingers). Reference sign Z1' designates an optimized cell with a reflection strength that is increased in positive direction and reference sign Z1" designates an optimized cell with a reflection strength that is reduced in positive direction. The optimized cell Z1' displays electrode fingers NF1", WF1", NF2" and WF2", whose width vs. the corresponding fingers of cell Z1 is optimized. The optimized cell Z1" displays electrode fingers NF1", WF1", NF2" and WF2", whose width is optimized vs. the corresponding fingers of cell Z1.

In order to increase the reflection strength of a cell radiating in a certain direction, the broad and therefore reflectively operating fingers are widened even further, preferably evenly and the narrow fingers are correspondingly narrowed, preferably also evenly. In order to reduce the reflection strength of a cell radiating in a certain direction, the wide and therefore reflectively operating fingers are narrowed and the narrow fingers are correspondingly widened.

In the case of a non-reflective cell, that is cell which displays several fingers of the same width, it is possible to shift the original zero reflection into a positive or negative direction through a slight alteration in width of certain fingers—as according to the invention with retention of the total finger width per cell.

In order to increase the reflective strength of cell Z1 which radiates in a positive direction in a positive direction, a part of the finger width of all narrows fingers is cut off and added to the wide fingers; see cell Z1'. The same part $\alpha/2$ of the (relative) finger width is thereby preferably taken from each narrow finger and the same part of the (relative) finger width is added to the neighboring wide finger, so that the sum of all finger widths as well as relative finger widths remains constant.

In order to reduce the reflective strength of cell Z1 which radiates in a positive direction (in positive direction) a part of the finger width of all, that is, reflectively operating, fingers is cut off and divided on the narrow fingers; see cell Z1". The same part $\alpha/2$ of the (relative) finger width is thereby preferably taken from each narrow finger and the same part of the (relative) finger width is added to the neighboring narrow finger, so that the sum of all finger widths as well as relative finger widths remains constant.

Cells Z2'-Z4' correspond to the optimized cells with a reflective strength increased in positive direction. Cells Z2"-Z4" correspond to the optimized cells with a reflective strength that is reduced in positive direction and increased in negative direction.

The non-optimized non-reflective cells Z3 and Z4 display four and/or two equally wide fingers. In order to increase reflection in the positive direction, the first and the third fingers are narrowed and the second and fourth fingers are correspondingly widened; see cells Z3' and Z4'. In order to increase the reflection in the negative direction, the first and third fingers are widened and the second and the fourth fingers are correspondingly narrowed; see cells Z3" and Z4".

The non-optimized and the cells optimized in accordance with the invention can basically be arranged directly beside each other or separated from each other by a sequence of cells of other cell types.

Figure 5:
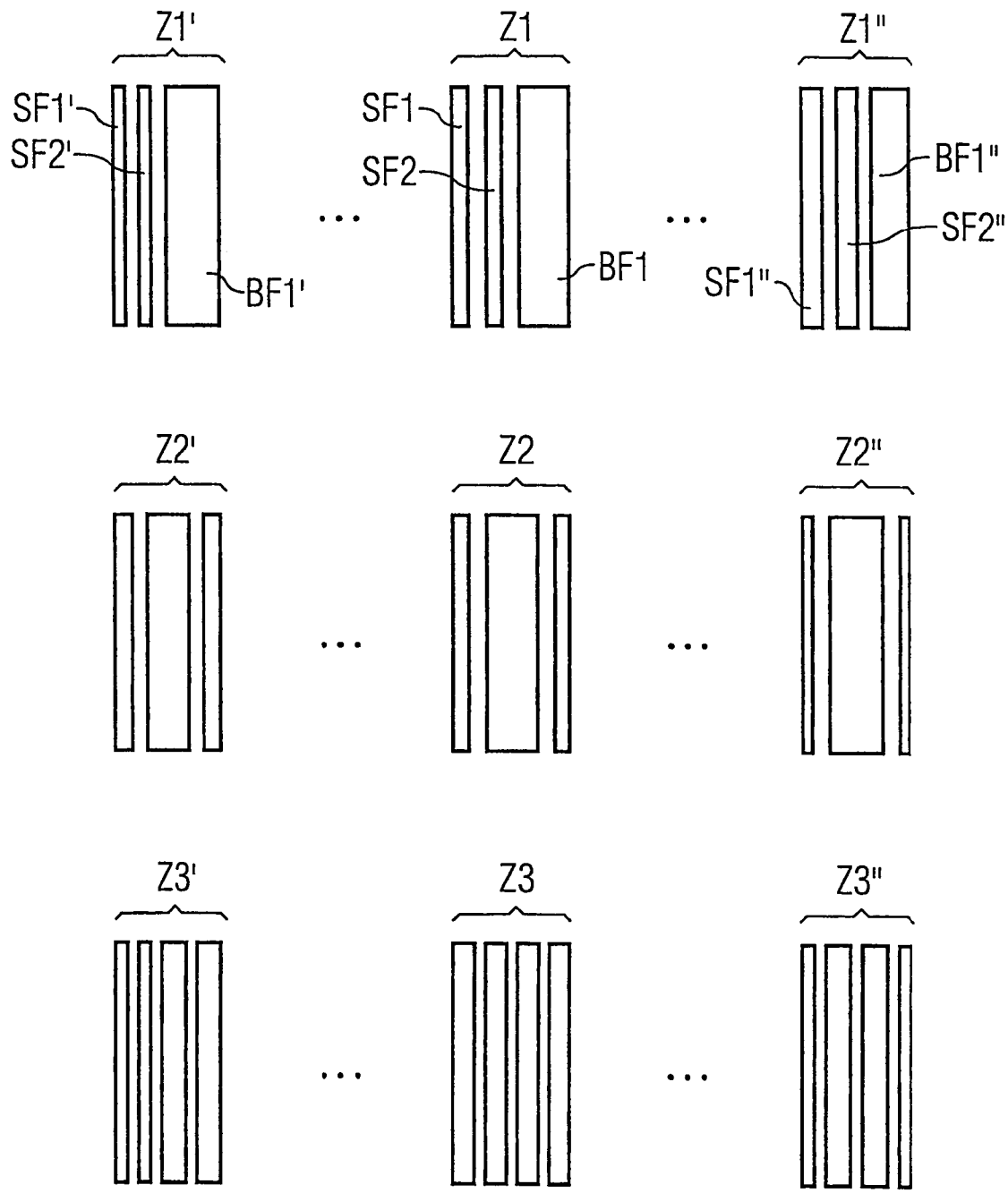
FIG. 5: cross-section of the second implementation form of a transducer according to the invention with cells of the EWC-cell class (Electrode Width Control cells).

FIG. 5 shows a cross-section of a further transducer according to the second implementation form of the invention. The transducer displays non-optimized function cells Z1-Z4 of the EWC-cell type as well as corresponding optimized function cells Z1', Z3' and Z1"-Z3" that all are arranged in one acoustic track.

The Z1 cell and the optimized cells Z1' and Z1" corresponds to cell type E11 or E21 according to the connection sequence of the electrode finger. These cells reflect positively (to the right).

The Z2 cell and the optimized cells Z2' and Z2' correspond to cell type E12 or E22 according to the connection sequence of the electrode finger. These cells reflect negatively (to the left).

The Z3 cell and the optimized cells Z3' and Z3" correspond to cell type E10 or E20 according to the connection sequence of the electrode fingers. These cells are non-reflective.

The Z1 cell displays two narrow electrode fingers NF1 and NF2 ($1^{st}$ and $2^{nd}$ fingers) and a wide electrode finger WF1 ($3^{rd}$ finger). The reference Z1' designates an optimized cell is with increased reflective strength and the reference sign Z1" designates an optimized cell with reduced reflective strength.

The reflectively operating finger WF1' of cell Z1' which radiates in a positive direction is somewhat widened with respect to the corresponding wide finger WF1 of cell Z1 and thereby the narrow fingers NF1 and NF2 are correspondingly narrowed in each case. Thereby the reflection of cell Z1' is increased in its positive direction. The reflection of cell Z1" is reduced vs. cell Z1.

In cell Z2 which radiates in a negative direction, a higher reflection is attained in a positive direction and a reduced reflection is attained in a negative direction respectively, so that the wide finger ($2^{nd}$ finger) is narrowed and the narrow fingers ($1^{st}$ and $3^{rd}$ fingers) are correspondingly widened; see cell Z2.' Inversely, in the optimized cell Z2" of this cell type, in negative direction an increased vs. in positive direction a reduced reflection is attained so that the wide finger ($2^{nd}$ finger) is widened and the narrow fingers ($1^{st}$ and $3^{rd}$ fingers) are correspondingly narrowed.

In the case of non-reflective cell Z3 with four equally wide fingers, the first two fingers are narrowed to offset the reflection in negative direction and the first and the last finger are narrowed to offset the reflection in positive direction.

Figure 6:
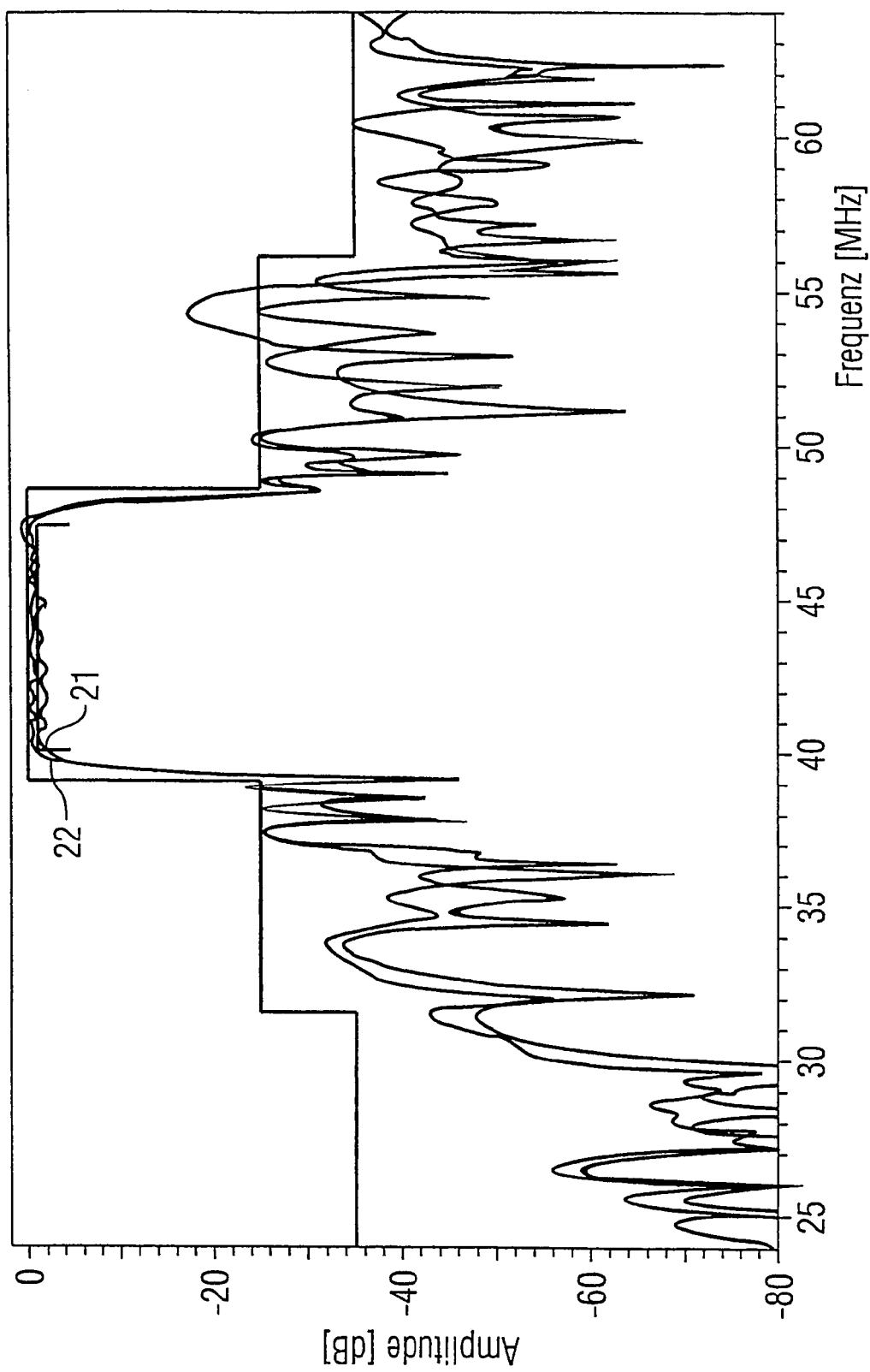
FIG. 6: comparison of the characteristic curves of the filters with a state-of-the-art transducer and with a transducer according to the invention.

FIG. 6 shows the transfer function 22 of a filter with an transducer optimized in accordance with the invention vs. the transfer function 21 of a filter with a non-optimized transducer. On the one hand, the optimized filter shows a lower insertion loss and, on the other hand, a higher proximal selection.

FIG. 7 shows the pass band of the transfer functions 22 and 21 increased in accordance with FIG. 6.

The relative width alteration of an optimized finger preferably amounts to up to 10% of the finger width.

In one implementation form of the invention, it is anticipated that the transducer with properties according to the invention will be used in a broad band filter, also called a FAN, whereby the absolute finger displacement or the finger mid displacement and the finger width of the transducer decrease in a transverse direction.

Although only a limited number of possible additional constructions of the invention could be described in the implementation examples, the invention is not limited to these. It is possible to produce electro-acoustically active structures such as, for example, transducers and reflectors in any number and design in order to change the properties of the filter wisely in a desired fashion. A filter according to the invention is also not restricted to the stated materials, the number of displayed elements or stipulated frequency range either.

The invention claimed is:

1. A surface acoustic wave (SAW) filter comprising:
a transducer comprising an acoustic track to pass a SAW, a center frequency of the filter exciting the SAW;
wherein the acoustic track comprises cells along a longitudinal direction of the acoustic track, each cell comprising electrode fingers, the cells comprising different cell types, where a cell type is defined by a connection sequence of electrode fingers in a cell;
wherein at least some of the cells are functional cells, each functional cell for exciting and/or reflecting the SAW;
wherein the functional cells comprise at least one functional cell having a length that corresponds to a phase shift of $2\pi n$ of the SAW where n is an integer;
wherein the functional cells comprise at least two functional cells of a same cell type; and
wherein the functional cells are configured so that, when the SAW passes through at least two functional cells that have different cell types, the SAW experiences different phase shifts of $\phi$ and $\phi'$.

2. A surface acoustic wave (SAW) filter comprising:
a transducer comprising an acoustic track to pass a SAW at a center frequency of the filter;
wherein the acoustic track comprises cells along a longitudinal direction of the acoustic track, each cell comprising electrode fingers, the cells comprising different cell types, where a cell type is defined by a connection sequence of electrode fingers of a cell;
wherein at least some of the cells are functional cells, each functional cell for exciting and/or reflecting the SAW;
wherein the functional cells comprise at least two functional cells, each of the at least two functional cells comprising at least one wide electrode finger and at least one narrow electrode finger, where a wide electrode finger is an electrode finger having a width that is greater than a width of a narrow electrode finger;
wherein a reflective strength of at least one of the functional cells is configurable by changing a width of an electrode finger in the at least one of the functional cells but by maintaining an overall width of the at least one of the functional cells substantially constant;
wherein the functional cells comprise at least one functional cell having a length that corresponds substantially to a phase shift of $2\pi n$ in the SAW excited at the center frequency, where n is an integer; and
wherein the functional cells are configured so that, when the SAW passes through at least two functional cells that have different cell types, the SAW experiences different phase shifts of $\phi$ and $\phi'$.

3. The filter of claim 1, wherein the acoustic track comprises a first acoustic track, and wherein the transducer further comprises a second acoustic track, the second acoustic track being substantially identical to the first acoustic track; and
wherein the first and second acoustic tracks are parallel and electrically interconnected.

4. The filter of claim 1 wherein the functional cells comprise at least two functional cells having a same cell type and having a same configuration but that are scaled differently in the longitudinal direction.

5. The filter of claim 1, wherein the functional cells comprise functional cells having more than one cell type and that are scaled differently.

6. The filter of claim 1, wherein the functional cells comprise at least two functional cells having a same cell type that are scaled differently, a difference in scaling of the at least two functional cells being between 0.1% and 20%.

7. The filter of claim 1, wherein the functional cells comprise at least two functional cells having a same cell type and having electrode finger groups with configurations that are substantially identical; and
wherein the functional cells comprise first, second, third and fourth functional cells, and wherein a final electrode finger of the first functional cell and an initial electrode finger of the second functional cell define a distance that is different from a corresponding distance in the third and fourth functional cells, the first and third functional cells having substantially same configurations and the second and fourth functional cells having substantially same configurations.

8. The filter of claim 1, wherein at least some of the cells have a length $\lambda/2$ and do not contribute to reflection or excitation of the SAW, where $\lambda$ is a wavelength.

9. The filter of claim 1, wherein the functional cells comprise functional cells having a same cell type and four electrode fingers per functional cell.

10. The filter of claim 1, wherein the functional cells comprise functional cells having three electrode fingers, at least one of the three electrode fingers being a wider electrode finger, the wider electrode finger being wider than another of the three electrode fingers, and wherein a width of the wider electrode finger is about $3\lambda/8$, or wherein the width of the wider electrode finger deviates from $3\lambda/8$ by at most 20%, where $\lambda$ is a wavelength.

11. The filter of claim 1, wherein at least one cell comprises an electrode finger having a width of about $m\lambda/16$ or having a width that, at most, deviates from $m\lambda/16$ by ± 20%, where m is an integer, and where $\lambda$ is a wavelength.

12. The filter of claim 2, wherein the acoustic track comprises a first acoustic track, and wherein the transducer further comprises a second acoustic track, the second acoustic track being substantially identical to the first acoustic track; and wherein the first and second acoustic tracks are parallel and electrically interconnected.

13. The filter of claim 2, wherein the functional cells comprise at least two functional cells having a same cell type and having a same configuration but that are scaled differently in the longitudinal direction.

14. The filter of claim 2, wherein the functional cells comprise functional cells having more than one cell type and that are scaled differently.

15. The filter of claim 2, wherein the functional cells comprise at least two functional cells having a same cell type that are scaled differently, a difference in scaling of the at least two functional cells being between 0.1% and 20%.

16. The filter of claim 2, wherein the functional cells comprise at least two functional cells having a same cell type and having electrode finger groups with configurations that are substantially identical; and wherein the functional cells comprise first, second, third and fourth functional cells, and wherein a final electrode finger of the first functional cell and an initial electrode finger of the second functional cell define a distance that is different from a corresponding distance in the third and fourth functional cells, the first and third functional cells having substantially same configurations and the second and fourth functional cells having substantially same configurations.

17. The filter of claim 2, wherein the functional cells comprise functional cells having a same cell type and four electrode fingers per functional cell.

18. The filter of claim 2, wherein the functional cells comprise functional cells having three electrode fingers, at least one of the three electrode fingers being a wider electrode finger, the wider electrode finger being wider than another of the three electrode fingers, and wherein a width of the wider electrode finger is about to $3\lambda/8$, or wherein the width of the wider electrode finger deviates from $3\lambda/8$ by at most 20%, where $\lambda$ is a wavelength.

19. The filter of claim 2, wherein at least one cell comprises an electrode finger having a width of about $m\lambda/16$ or having a width that, at most, deviates from $m\lambda/16$ by ± 20%, where m is an integer, and where $\lambda$ is a wavelength.

20. A surface acoustic wave (SAW) filter comprising:

a transducer comprising an acoustic track to pass a SAW at a center frequency of the filter;

wherein the acoustic track comprises cells along a longitudinal direction of the acoustic track, each cell comprising electrode fingers, the cells comprising different cell types, where a cell type is defined by a connection sequence of electrode fingers of a cell;

wherein at least some of the cells are functional cells, each functional cell for exciting and/or reflecting the SAW;

wherein the functional cells comprise at least two functional cells, each of the at least two functional cells comprising at least one wide electrode finger and at least one narrow electrode finger, where a wide electrode finger is an electrode finger having a width that is greater than a width of a narrow electrode finger;

wherein a reflective strength of at least one of the functional cells is configurable by changing a width of an electrode finger in the at least one of the functional cells but by maintaining an overall width of the at least one of the functional cells substantially constant; and wherein at least some of the cells have a length $\lambda/2$ and do not contribute to reflection or excitation of the SAW, where $\lambda$ is a wavelength.

* * * * *

UNITED STATES PATENT AND TRADEMARK OFFICE
CERTIFICATE OF CORRECTION

| | | |
|---|---|---|
| PATENT NO. | : 7,489,213 B2 | Page 1 of 1 |
| APPLICATION NO. | : 10/568049 | |
| DATED | : February 10, 2009 | |
| INVENTOR(S) | : Thomas Ebner | |

It is certified that error appears in the above-identified patent and that said Letters Patent is hereby corrected as shown below:

On the Title page, col. 1, (73), Assignee: delete "Epcos" and insert -- EPCOS --.

Signed and Sealed this

Twenty-fourth Day of March, 2009

JOHN DOLL
*Acting Director of the United States Patent and Trademark Office*